United States Patent
Pala

(10) Patent No.: US 10,818,662 B2
(45) Date of Patent: Oct. 27, 2020

(54) SILICON CARBIDE MOSFET WITH SOURCE BALLASTING

(71) Applicant: Alpha and Omega Semiconductor (Cayman) Ltd., Grand Cayman (KY)

(72) Inventor: Vipindas Pala, San Jose, CA (US)

(73) Assignee: Alpha and Omega Semiconductor (Cayman) Ltd., Grand Cayman (KY)

(*) Notice: Subject to any disclaimer, the term of this patent is extended or adjusted under 35 U.S.C. 154(b) by 29 days.

(21) Appl. No.: 16/135,372

(22) Filed: Sep. 19, 2018

(65) Prior Publication Data
US 2020/0091147 A1    Mar. 19, 2020

(51) Int. Cl.
| | | |
|---|---|---|
| H01L 29/86 | (2006.01) | |
| H01L 27/092 | (2006.01) | |
| H01L 29/16 | (2006.01) | |
| H01L 21/033 | (2006.01) | |
| H01L 29/10 | (2006.01) | |
| H01L 29/78 | (2006.01) | |
| H01L 29/08 | (2006.01) | |

(52) U.S. Cl.
CPC ........ *H01L 27/092* (2013.01); *H01L 21/0337* (2013.01); *H01L 29/086* (2013.01); *H01L 29/1033* (2013.01); *H01L 29/1095* (2013.01); *H01L 29/1608* (2013.01); *H01L 29/7806* (2013.01)

(58) Field of Classification Search
CPC . H01L 27/086; H01L 27/092; H01L 27/1033; H01L 29/86
See application file for complete search history.

(56) References Cited

U.S. PATENT DOCUMENTS

| | | | |
|---|---|---|---|
| 5,322,802 A | 6/1994 | Baliga et al. | |
| 6,100,169 A | 8/2000 | Suvorov et al. | |
| 7,381,992 B2 | 6/2008 | Ryu | |
| 2019/0386129 A1* | 12/2019 | Lee | H01L 29/66727 |

OTHER PUBLICATIONS

Corporate Research & Development Group, Mitsubishi Electric Corporation, "Mitsubishi Electric Develops SiC Power Device with Record Power Efficiency", Public Relations Division, Mitsubishi Electric Corporation, Sep. 22, 2017.

* cited by examiner

*Primary Examiner* — Trang Q Tran
(74) *Attorney, Agent, or Firm* — JDI Patent; Joshua D. Isenberg; Robert Pullman

(57) ABSTRACT

An integrated device and a method for making said integrated device. The integrated device includes a plurality of planar MOSFETs that have a first contact region formed in a first source region of a plurality of source regions and a second contact region formed in a second source region of the plurality of source regions. The first and second contact regions have respective portions of the source region doped with the second conductivity type, and the first and second contact regions are separated by a JFET region, wherein the JFET region is longer in one planar dimension than the other and the first and second contact regions are separated by the longer planar dimension. The JFET region is bounded on at least one side corresponding to the longer planar dimension by a source region and a body region in conductive contact with at least one contact region.

9 Claims, 12 Drawing Sheets

TOP VIEW

SILICON CARBIDE MOSFET WITH SOURCE BALLASTING

FIELD OF DISCLOSURE

Aspects of the present disclosure are related to power integrated circuits and more specifically to an integrated power device that includes planar MOSFETs with source ballasting in a silicon carbide substrate.

BACKGROUND

The majority of semiconductor power devices are fabricated using silicon as a substrate. Recently, a trend has developed towards fabricating power devices using silicon carbide (SiC), specifically for high voltage power devices. Silicon carbide exhibits several desirable characteristics compared with silicon including the ability to operate at a high temperature, high power level, and high frequency. Additionally, silicon carbide power devices exhibit low specific on-resistance ($R_{DSon}$) and high thermal conductivity, specifically 500 to 1000 times higher than silicon power devices, making it desirable for use in constructing power devices.

Maintaining the low $R_{DSon}$ in power device design means having either a short channel length or operating the power device at a high overdrive voltage compared to devices with similar voltage ratings. These factors combined with the fact that the drift region thickness in silicon carbide power devices is 10 times smaller than in silicon power devices leads to silicon carbide power devices having inferior short circuit characteristics compared to similar plain silicon devices.

It is within this context that embodiments of the present invention arise.

DESCRIPTION OF THE SPECIFIC EMBODIMENTS

Figure 1A:
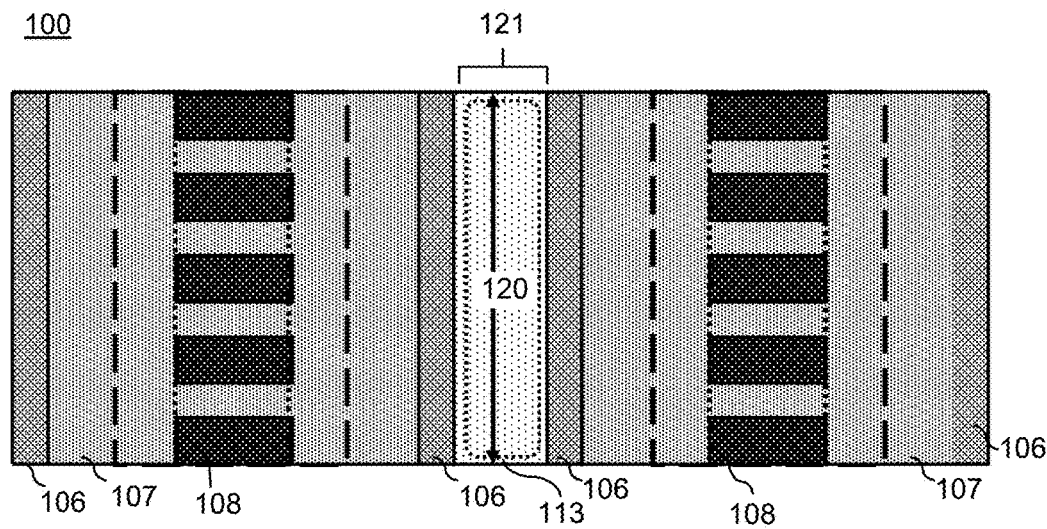
FIG. 1A shows a top down schematic view of a prior art silicon carbide MOSFET integrated device.
Figure 1B:
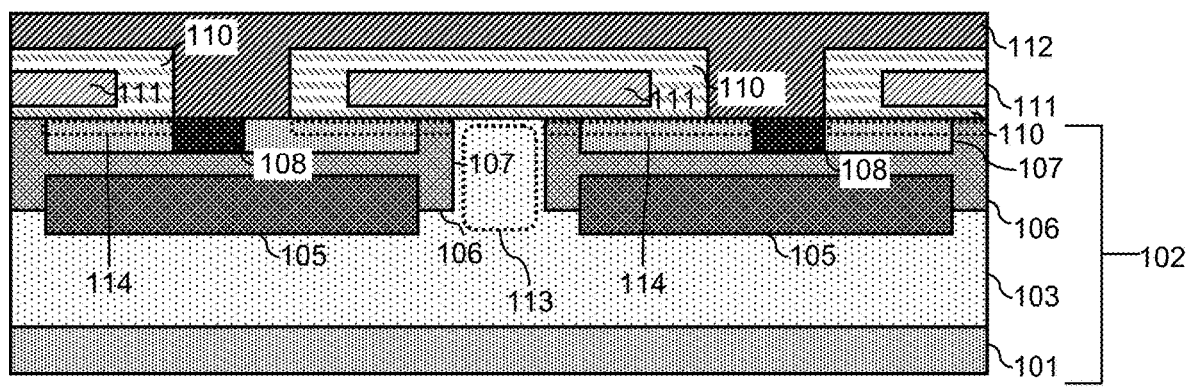
FIG. 1B shows a side view cross-sectional schematic of the prior art silicon carbide MOSFET integrated device of FIG. 1A.

FIG. 1A-1B are schematic diagrams of a prior art silicon carbide planar MOSFET integrated power device 100. It is important to note that this integrated structure 100 fails to exhibit optimal short circuit characteristics, and is depicted in order to illustrate the traditional structure of silicon carbide planar MOSFET integrated devices. The silicon carbide planar MOSFET integrated power device 100 is configured in a similar manner to prior art silicon planar MOSFET integrated power devices that use a silicon substrate. FIG. 1A shows a top down schematic diagram of the prior art silicon carbide planar MOSFET Power Device while FIG. 1B shows a cross-sectional schematic diagram.

The silicon carbide planar MOSFET integrated power device 100 is fabricated using a silicon carbide substrate composition 102 doped with a first conductivity type. As illustrated, this silicon carbide substrate composition 102 is composed of a heavily doped silicon carbide substrate 101 of the first conductivity type and covered with a lightly doped epitaxial layer 103 of silicon carbide grown, deposited or otherwise formed on a surface of the substrate 101. Alternatively, silicon carbide substrate composition 102 may be composed of only the silicon carbide substrate 101. The silicon carbide substrate 101 forms the drain region of each MOSFET device in the integrated power device 100.

A plurality of body regions 105 of a second conductivity type are formed in an upper portion of the epitaxial layer 103. The body regions 105 are doped such that it has an opposite conductivity type to that of the substrate composition 102. By way of example, and not by way of limitation, the body regions 105 may be p-type for an n-type silicon carbide substrate composition 102. A plurality of source regions 107 of the first conductivity type are formed within the upper portion of each of the plurality of body regions 105. Optionally a lightly doped well region of the second conductivity type 106 may be formed in the body region 105 and the source region 107 may be formed in an upper portion of the well region 106. By way of example, and not by way of limitation, the source region 107 may be n+ type for an n-type silicon carbide substrate composition and p-type body region. The notation n+ type means that it is doped with a higher concentration of dopants than the n-type substrate composition 102. A contact region 108 is formed in the source region 107. A portion of the source region corresponding to the contact region 108 is heavily doped with materials such that it has the second conductivity type. An insulator layer 110 is formed on top of the substrate. The insulator layer may be silicon oxide (SiO$_2$) grown over top the silicon carbide substrate composition 102. A conductive material forms the gate electrode 111 of each MOSFET device in the integrated power device 100. The conductive material may be polysilicon or some other conductive material known in the art. A second insulator layer may be created overtop the conductive layer and joined with the insulator below the conductive layer 111. The second insulator layer may be, without limitation, another SiO$_2$ layer grown on from the polysilicon layer or some other insulator placed on top the conductive layer. Holes created in the insulator layer and the conductive material layer allow a source metal layer 112 make ohmic contact with the source region 107 at the contact region 108. In FIG. 1A openings through the insulator material 110 and conductive layer 111 are indicated by dotted and dashed lines, respectively.

The opening between the body regions 105 is sometimes referred to as the "JFET" region 113. In some implementations, the JFET region 113 may have a heavier doping compared to epitaxial region. This may be accomplished through implantation. A channel region 114 forms on the surface of the body region 105, between the JFET region 113 and the source region 107. The channel region forms when an appropriate voltage is applied to the gate electrode 111 so that the MOSFET operates in the on-state. The channel region 114 allows current to flow from the source region to the drain region. In this prior art implementation the JFET region 113 runs parallel to the contact regions 108. As a result, the JFET region 113 has a long planar dimension (width) 120 and a short planar dimension (length) 121. The long planar dimension 120 spans the width of the contact region 108 and the short planar dimension 121 is the distance between the two contact regions 108. The result of this JFET region is a channel region with a pitch closely tied to the pitch of the contact region. This prior art JFET region and channel region configuration is limited by carrier mobility, which cannot be improved by changing the layout. Decreasing the channel resistance by reducing the channel length or increasing channel density in this layout results in inferior short circuit characteristics.

Figure 2A:
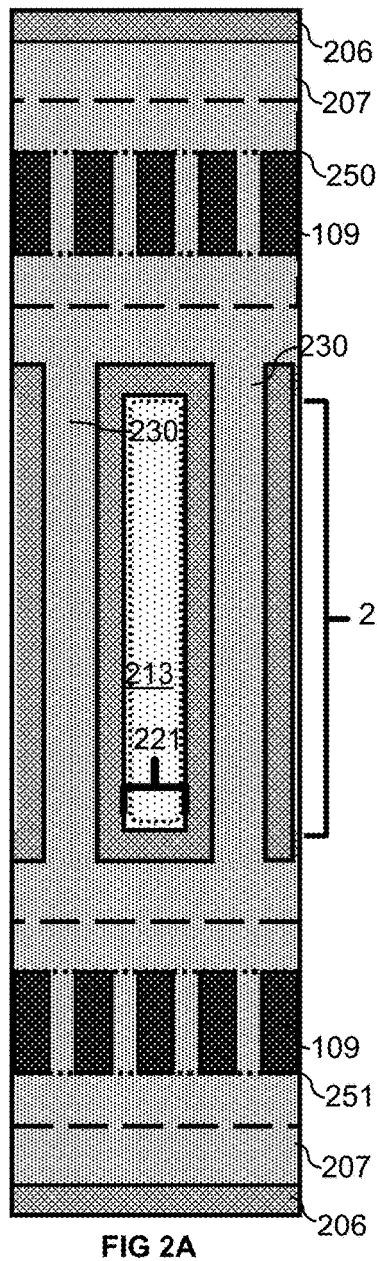
FIG. 2A depicts a top down schematic view of a silicon carbide planar MOSFET integrated device with source ballasting according to aspects of the present disclosure.

FIG. 2A shows a planar MOSFET power device with Source Ballasting according to aspects of the present disclosure. Here the channel region has been flipped so that the longer planar dimension (width) 220 separates a first contact region 250 from a second contact region 251. Each of the contact regions 250, 251 includes one or more contacts 109 heavily doped with materials such that they have the second conductivity type. JFET regions 213 are formed between body regions 205 and well region 206. Channel regions 214 form on the surface of the body regions 205, between the JFET region 213 and source regions 230 when a voltage appropriate to operate the MOSFET in the on-state is applied to an electrically insulated gate electrode 211. As in the device shown in FIGS. 1A-1B, the JFET regions 213 may have a heavier doping compared to the epitaxial region 203.

Figure 2B:
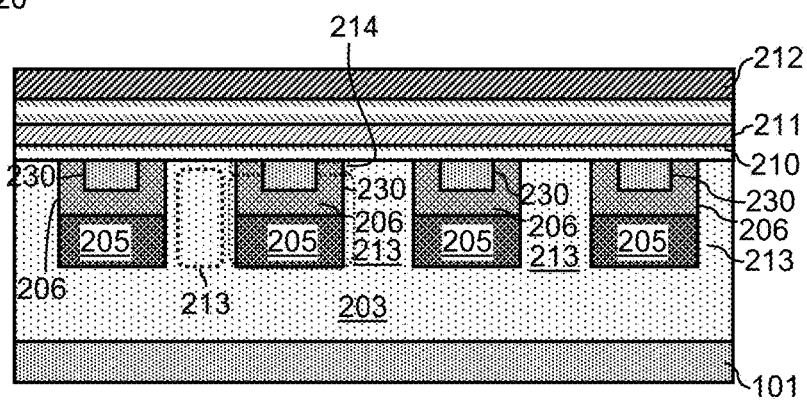
FIG. 2B depicts a side view cross-sectional schematic between the contact regions of a silicon carbide planar MOSFET integrated device with source ballasting according to aspects of the present disclosure

In the configuration shown in FIGS. 2A-2B the shorter planar dimension (length) 221 of the channel separates one source region 230 from another. The benefit of the configuration shown in FIGS. 2A-2B is that the pitch of the channel region is decoupled from the pitch of the contact region. This decoupling allows an increase in channel region density without correspondingly increasing the density of contact regions as would happen with a prior art layout, such as that shown in FIG. 1A. Further because channel density and contact density are decoupled, the source resistance and channel resistance can be modified independently leading to improved short circuit characteristics.

As seen in the cross section schematic diagram shown in FIG. 2B, there are several JFET regions 213 shown. Source regions 230 are formed in the upper layer of a body region 205 or (optionally) a well region 206 between adjacent JFET regions 213. As discussed above a well region 206 may be formed above each body region 205 and the body regions are formed in the epitaxial layer 203 of the substrate composition. An insulator layer 210 is formed over top of the JFET regions 213, body region 205, (optional) well region 206 and bounding source regions 230. The gate electrode 211 may be formed from an electrically conductive layer created on top of the insulator layer 210 and a second insulator layer is formed over top the conductive layer 211. Finally a source metal layer 212 may be created on top of the insulator. Note that the metal contact layer does not make ohmic contact with the conductive layer or the source layer. Unlike plain silicon MOSFET power devices the insulator and conductive layer may be formed overtop all regions of the device except the contacts regions. In FIG. 2A openings through the insulator material 210 and conductive layer 211 are indicated by dotted and dashed lines, respectively.

Figure 3A:
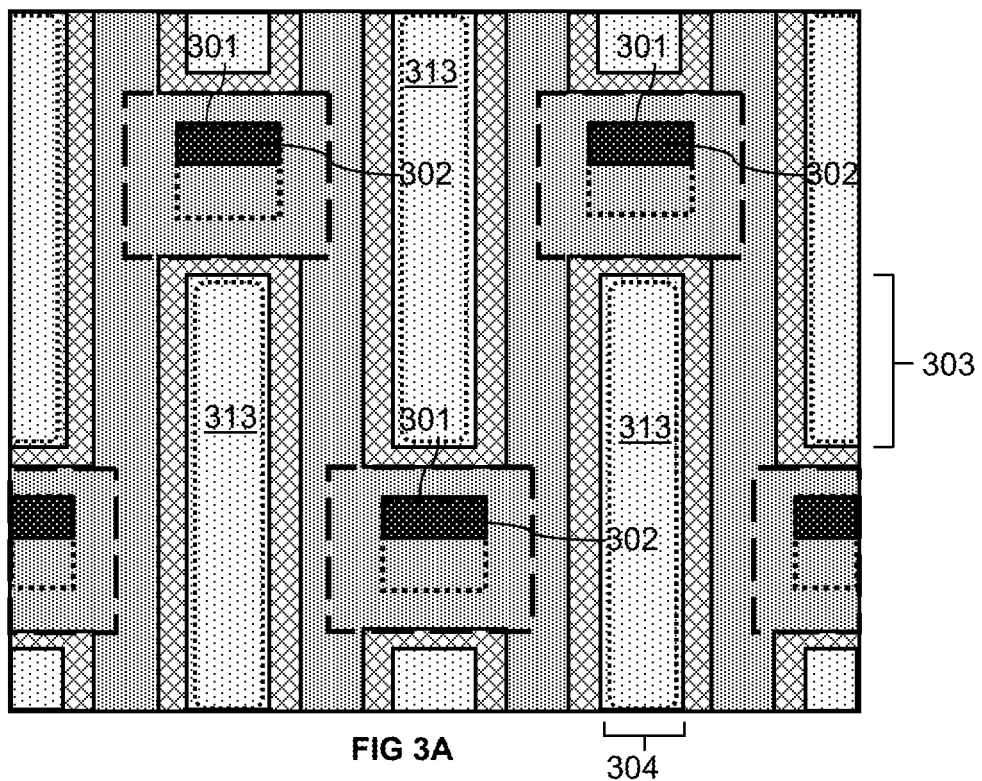
FIG. 3A shows a top down view schematic of a silicon carbide planar MOSFET integrated device with source ballasting having offset contact regions in a checkerboard pattern according to aspects of the present disclosure.
Figure 3B:
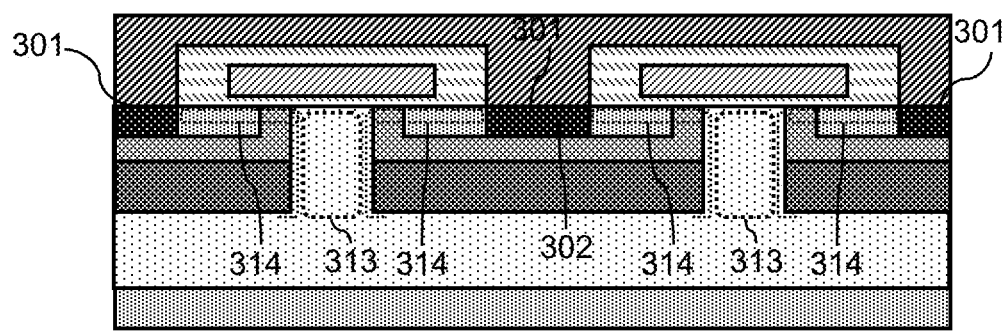
FIG. 3B shows a side view cross-sectional schematic of the contact regions of a silicon carbide planar MOSFET integrated device with source ballasting having offset contact regions in a checkerboard pattern according to aspects of the present disclosure.

FIGS. 3A-3B show a further improvement to the traditional silicon carbide MOSFET power device design according to aspects of the present disclosure. In this embodiment the source resistance has been increased with respect to FIGS. 2A-2B by increasing the distance between contact regions and channel region density has also been increased. The contact regions 301 (for example a first and second contact region) are staggered or offset from one another to create a checker board type pattern. Each contact region 301 is separated by channel gap in either a shorter planar dimension 304 or a longer planar dimension 303. Additionally in these embodiments the JFET regions 313 are bounded in the shorter planar dimension by a contact region on only one side and as such the distance 303 between contact regions 301 may be shorter than the entire length of the JFET regions 313 and therefore shorter than the length of corresponding channel regions 314. According to an additional aspect of the present disclosure the orientation of the portion of the contact region that is heavily doped with the first conductivity type 302 may rotated such that is parallel with shorter planar dimension of the channel region 304. These embodiments allow for further tuning of the source region resistance while also increasing the density of the channel region. In FIG. 3A dotted and dashed lines indicate, openings through an insulator material and an overlying conductive layer respectively.

Figure 4:
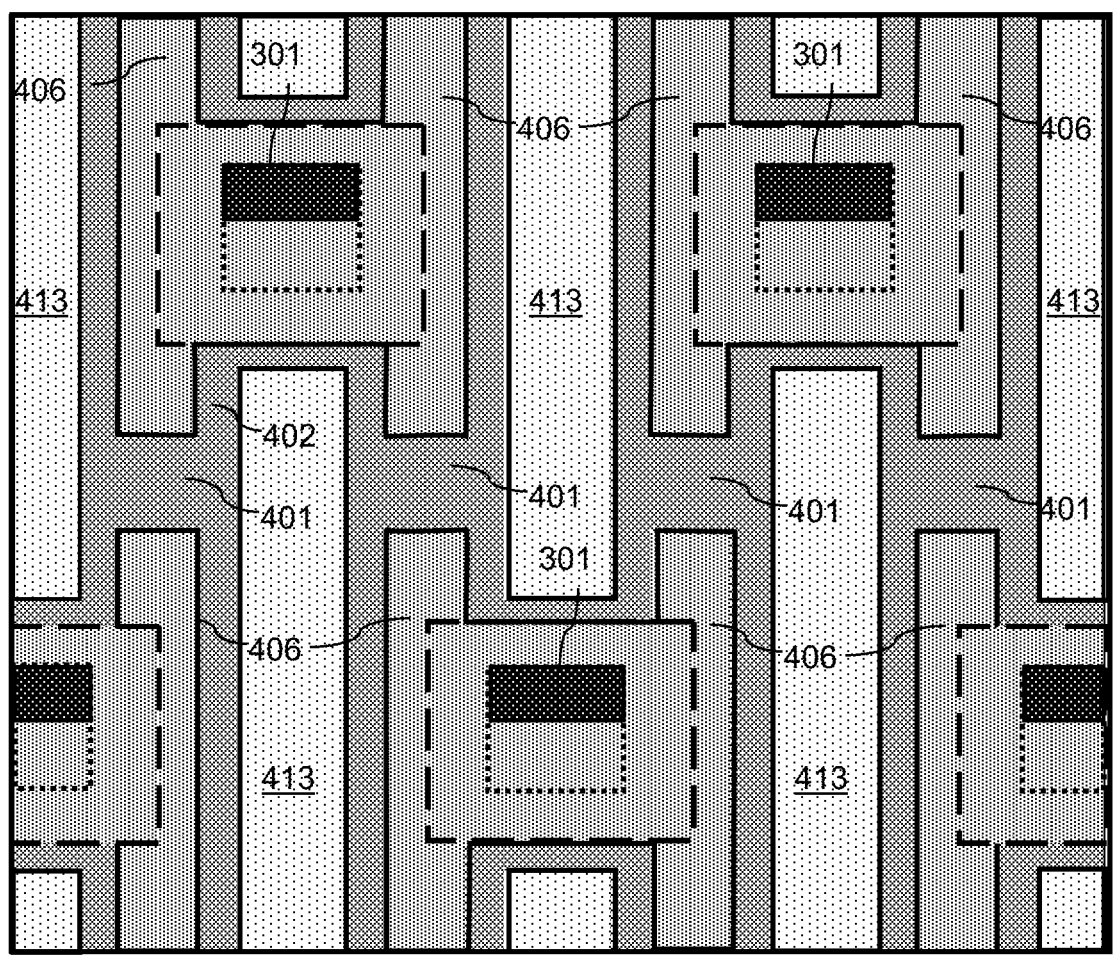
FIG. 4 is a top down schematic view of a silicon carbide planar MOSFET integrated device with source ballasting having offset contact regions in a checkerboard pattern with gaps in the source regions bounding the channel regions according to aspects of the present disclosure.

FIG. 4 shows another alternative implementation of a silicon carbide MOSFET integrated device according to aspects of the present disclosure. In this embodiment the resistance of the source region 406 is further increased by forming a gap 401 in the source region between the contact regions 301. The body region or (optionally) the well region 402 is continuous between the contact regions 301 and bounds the JFET regions. Eliminating source region between the contact regions allows the channel density and source resistance to be tuned. Channel regions are formed between the JFET regions 413 and the source regions 406. Therefore there is no channel in the gap 401, hence channel density is reduced resulting in a net improvement in the short circuit characteristics for the device. In FIG. 4, dotted and dashed lines indicate openings through an insulator material and an overlying conductive layer respectively.

Figure 5:
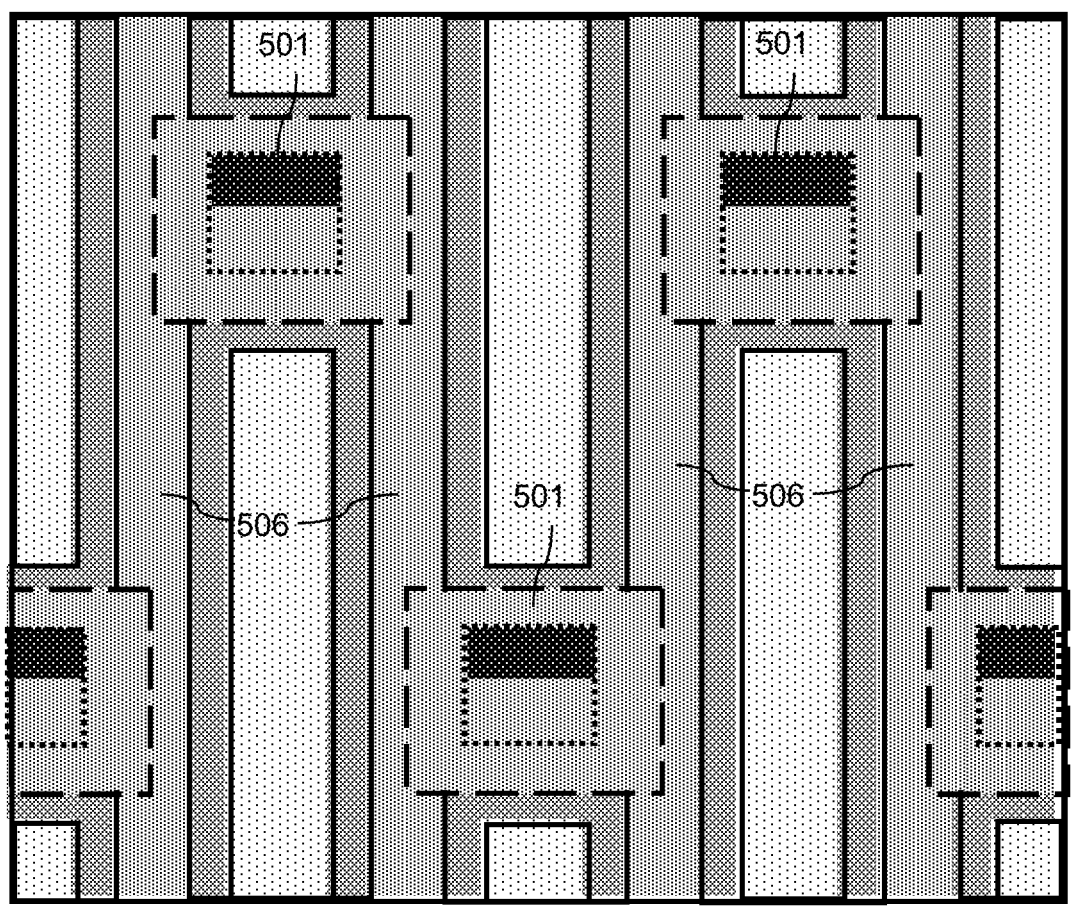
FIG. 5 depicts a top down schematic view of a silicon carbide planar MOSFET integrated device with source ballasting having offset contact regions in a checkerboard pattern with lightly doped source regions bounding the channel regions according to aspects of the present disclosure.

FIG. 5 depicts another alternative implementation of the silicon carbide MOSFET integrated device according to aspects of the present disclosure. In this implementation the resistance of the source region 506 is increased by lightly doping the source region in the areas bounding the channel region in the longer planar dimension. The contact region 501 is heavily doped. Reducing the doping concentration in the source regions bounding the channel regions 506 between the contact regions increases the source resistance. Lightly doped source regions show increased resistance because there are fewer carriers in the source region. In FIG. 5, dotted and dashed lines indicate openings through an insulator material and an overlying conductive layer, respectively.

Figure 6:
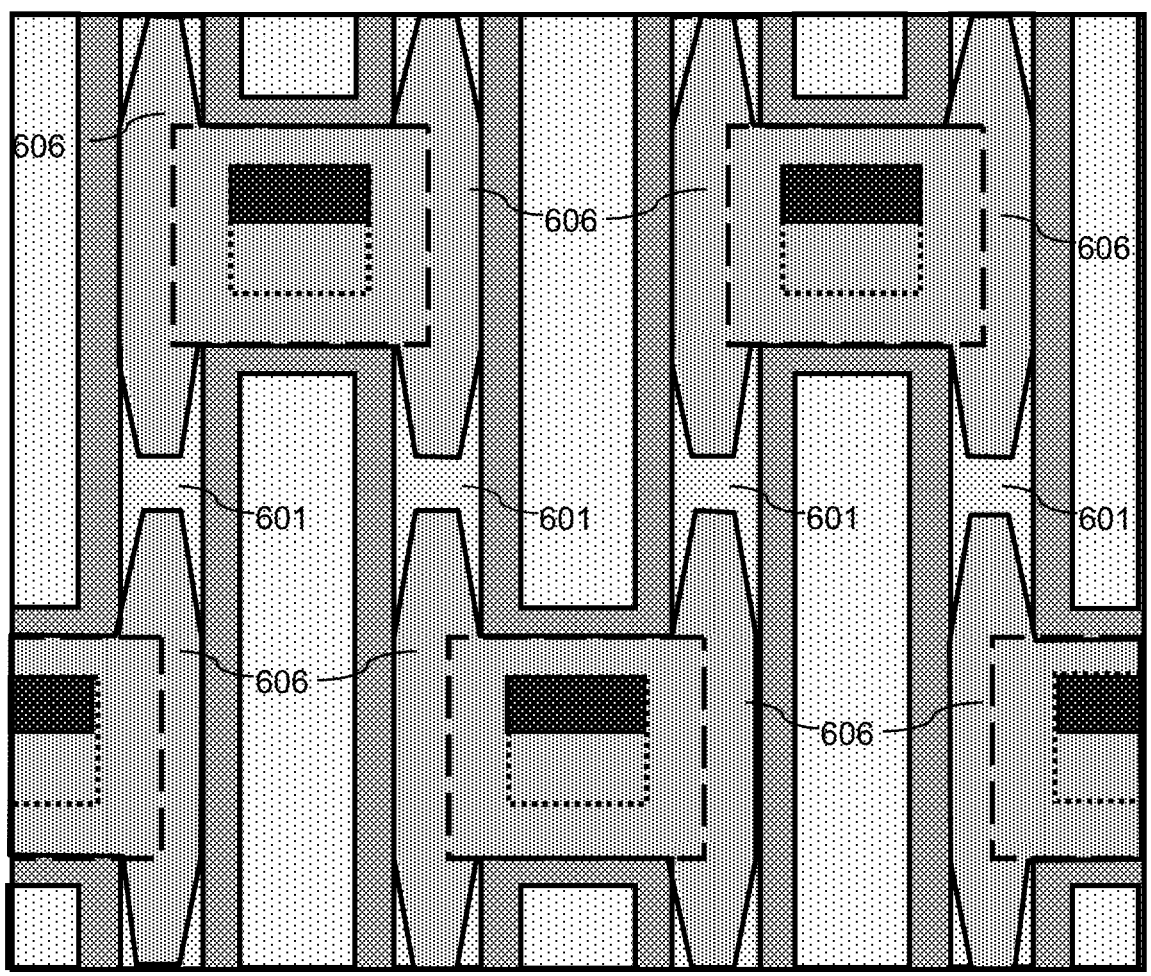
FIG. 6 is a top down schematic view of a silicon carbide planar MOSFET integrated device with source ballasting having offset contact regions in a checkerboard pattern with heavily doped source regions that taper to lightly doped source regions, bounding the channel regions according to aspects of the present disclosure.

FIG. 6 shows another embodiment of the silicon carbide MOSFET integrated device according to aspects of the present disclosure. The doping concentration of the source region 606 bounding the channel region in this embodiment tapers off between the contact regions. The doping concentration may create gaps between heavily doped source regions 606. These gaps may be lightly doped source regions 601 of the first conductivity type. Tapering the heavily doped source regions further improves the devices short circuit characteristics by increasing the source resistance, which reduces current during a short circuit. In FIG. 6, dotted and dashed lines indicate openings through an insulator material and an overlying conductive layer, respectively.

Figure 7A:
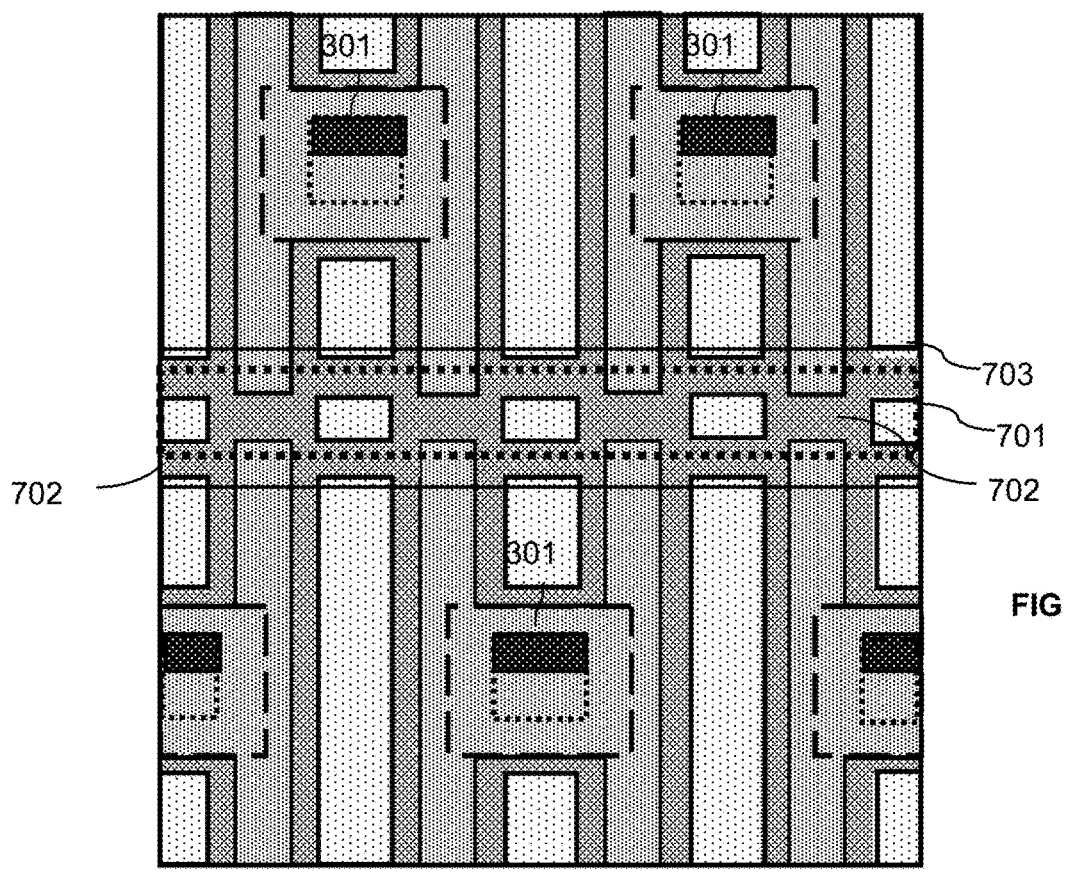
FIG. 7A shows is a top down schematic view of a silicon carbide planar MOSFET integrated device with source ballasting having offset contact regions in a checkerboard pattern with a Schottky contact between the contact regions according to aspects of the present disclosure.
Figure 7B:
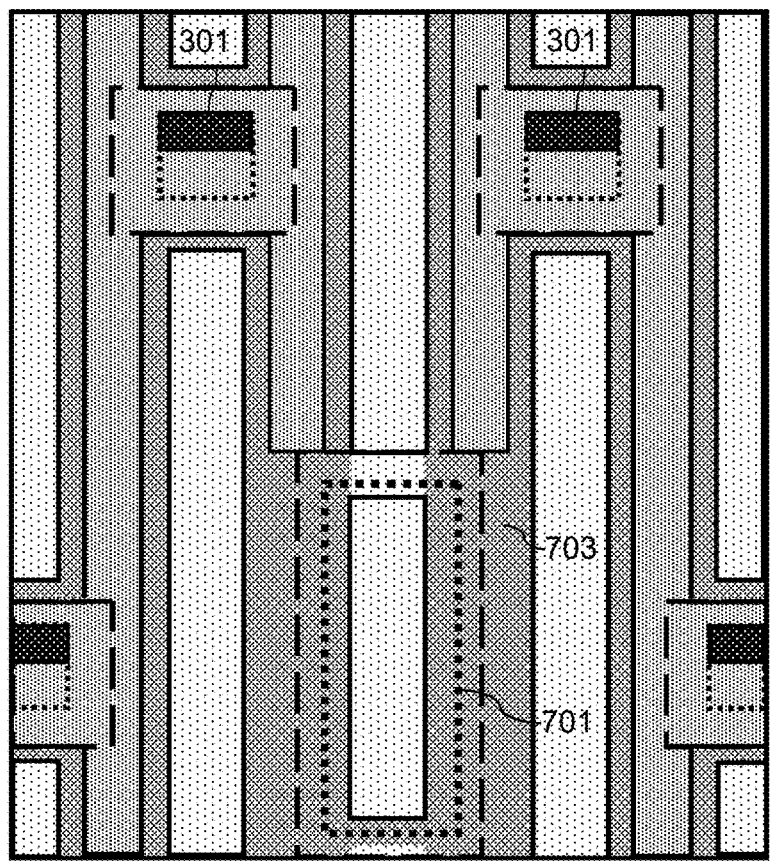
FIG. 7B shows is a top down schematic view of a silicon carbide planar MOSFET integrated device with source ballasting having offset contact regions in a checkerboard pattern with a Schottky contact replacing one of the contact regions according to aspects of the present disclosure.

In some implementations, a Schottky diode may be formed in the epitaxial layer of the substrate and in ohmic contact with the source region as depicted in FIGS. 7A and 7B. As shown in FIG. 7A the Schottky diode 701 may be placed in a gap 702 created in the source regions that bound the channel regions. The body region and (optionally) the well region may be continuous between the contact regions 301 and follow the contours of the Schottky contact. In an alternative embodiment shown in FIG. 7B the Schottky contact may be located on top of the opening between two adjacent body regions. A body region or (optionally) well region 703 may be continuous along the interface of the Schottky contact 701 and span between the two source regions. In FIG. 7A and FIG. 7B openings through an insulator material and an overlying conductive layer are indicated by dotted and dashed lines, respectively.

Formation

Figure 8A:
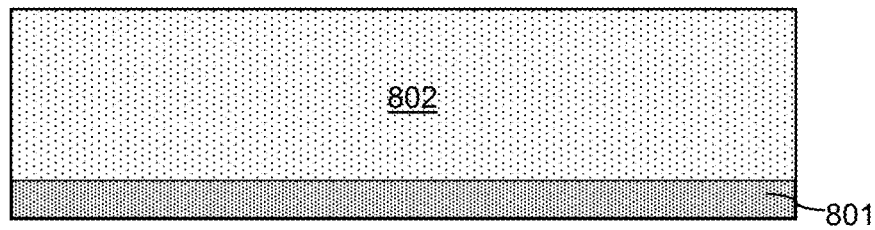
FIGS. 8A-8I depict a process for making a silicon carbide planar MOSFET integrated device with source ballasting according to aspects of the present disclosure

FIGS. 8A-8I show the steps of an example fabrication method for the silicon carbide MOSFET integrated device with source ballasting according to aspects of the present disclosure. As depicted in FIG. 8A, fabrication starts with a silicon carbide wafer substrate composition having a heavily doped substrate 801 and a relatively lightly doped epitaxial layer 802 of the first conductivity type. The heavily doped substrate may be for example an N$^+$ substrate with a doping concentration of 1e17-1e20 cm$^{-3}$, the lightly doped epitaxial layer may be for example an N layer with a doping concentration of 1e13-1e17 cm$^{-3}$ and may be 3-150 μm thick.

Figure 8B:
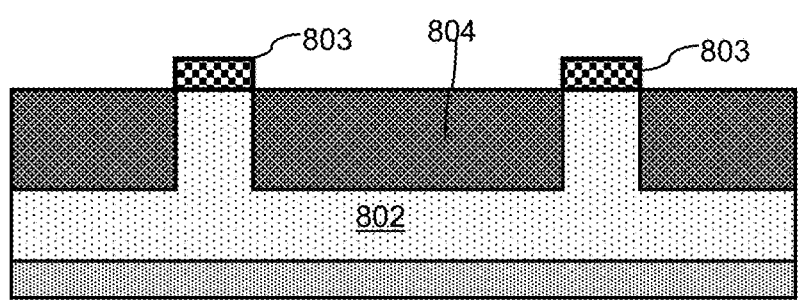
Figure 8B:
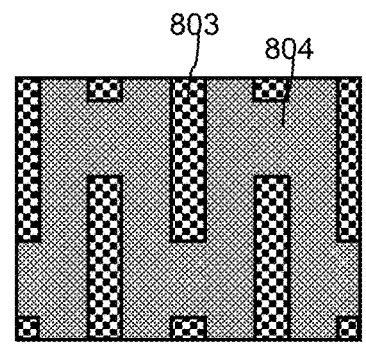

A first mask 803 is created on top of the substrate composition as shown in FIG. 8B. The first mask 803 may be placed in such a way that a JFET region has longer planar dimension and a shorter planar dimension as can be seen from the top down view of FIG. 8B. By way of example and not by limitation the mask 803 may be positioned to create JFET openings with a width between 1 μm and 20 μm and a length between 0.5 μm and 5 μm. These dimensions roughly correspond to the widths and lengths of the channel regions. The mask may be formed from a photoresist or oxide deposited on the surface of the substrate composition or some other mask known in the art. A body region 804 of a second conductivity is created in the open areas of the mask using ion implantation. The body region of the second conductivity type may be for example a P$^+$ body region with a doping concentration of 1e16-1e18 cm$^{-3}$ and a layer thickness of 0.5-1.5 μm. The mask layout may be configured so that the body region bounds the channel region in the longer planar dimension. The openings in the mask layout may be characterized by a space of between 1 and 2 μm between openings. In some embodiments a lightly doped well region of the second conductivity type 805 is implanted overtop the body region 804 through the same mask openings. The lightly doped well may for example be a P$^-$ well region with a doping concentration of about 1e16-1e18 cm$^{-3}$ and a thickness of about 0.5-1.5 μm.

Figure 8C:
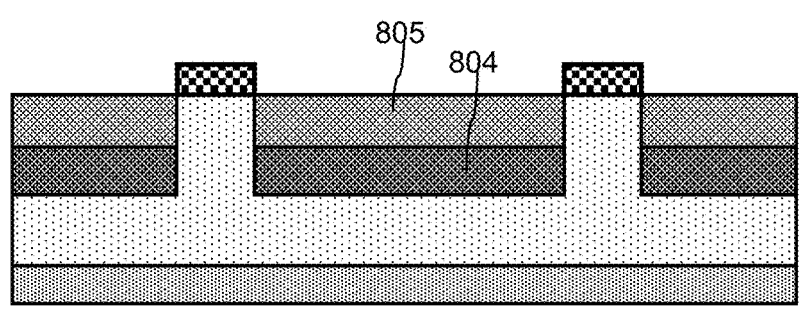
Figure 8C:
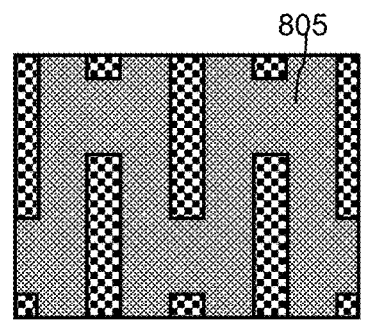
Figure 8D:
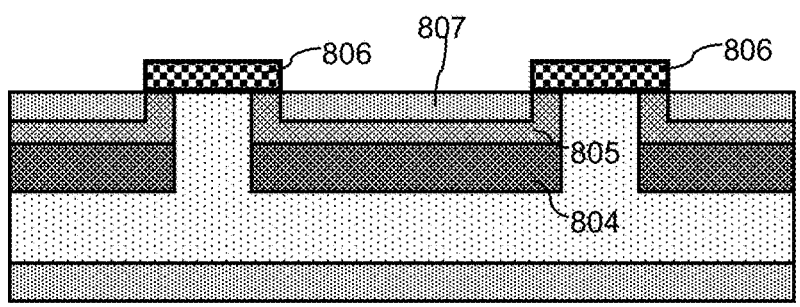
Figure 8D:
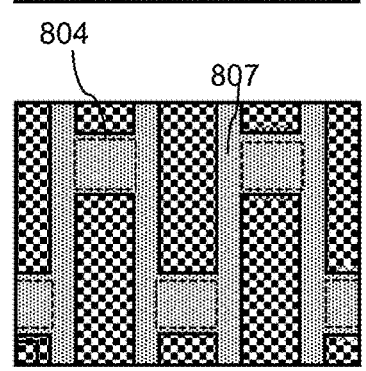

The first mask 803 is removed and a second mask 806 for creating the source region may be generated on the surface of the substrate composition as shown in FIG. 8D. In some implementations, the new mask may be created by deposition and patterned etching of silicon oxide on the surface of the substrate composition or by depositing a photoresist and performing photolithography to create the desired layout. A source region of the first conductivity type may then be implanted in an upper portion of the body region 804 or (optionally) the well region 805. Thus, a channel region is created in the substrate region between the JFET region and the source region when the device is active. The channel region has longer planar dimension and a shorter planar dimension as it is formed along the contours of the JFET region and source region. The source region of the first conductivity type may for example be an N$^+$ source region with a doping concentration of 1e18-1e21 cm$^{-3}$. The openings in the second mask 806 may have a width between 0.2 and 1 μm in stipe-like portions that run parallel to the channel region and a width of about 4 μm in the region that will become the contact region. As can be seen from the top down view, the source regions 807 body regions 804 and (optionally) well regions 805 run parallel to the longer planar dimension of the JFET regions. The mask 806 covers the entirety of the surface of the JFET region and areas that will form the channel region. The source regions 807, body regions 804 and (optionally) well regions 805 also create a plurality of precursors to contact regions 809 between JFET regions. The contact regions may be longer than the shorter planar dimension of the channel region and be in ohmic contact with the source regions 807, body regions 804 and (optionally) well regions 804 that bound the JFET region in the longer planar dimension.

Figure 8E:
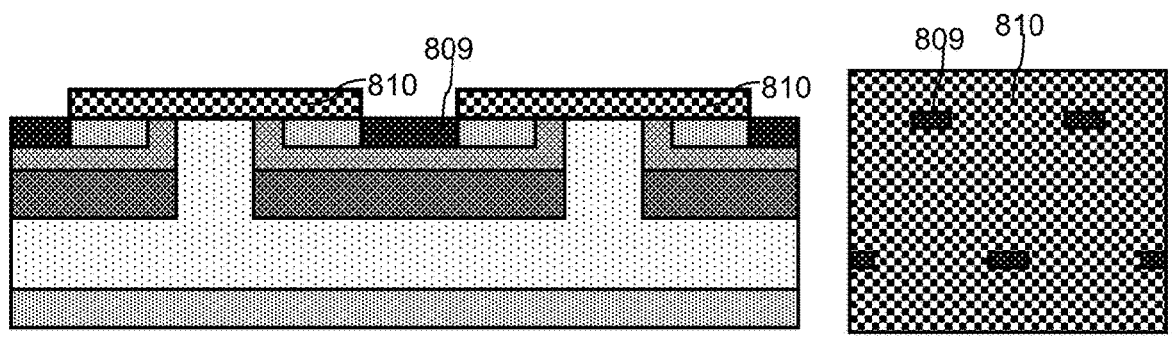

To complete the contact region 809 a portion of the source region 807 is doped with the second conductivity type as depicted in FIG. 8E to create a source contact with the body region or (optionally) the well region. The portion 809 of the source region doped with the second conductivity type may be for example a P$^+$ portion with a doping concentration of 1e18-1e21 cm$^{-3}$. To form this portion, a third mask 810 is extended over the surface of the substrate composition covering all areas except for the desired portion of the contact region 809. Formation of the mask 810 may be performed by removal of the previous mask 806 and creation of the new mask on the surface of the substrate composition or by the addition of masking material to the previous mask. The third mask 810 may be characterized by openings over the region that will become the contact region that are smaller than the openings in the second mask 806 and are separated by a larger space between openings, e.g., about 5 μm. The portion of contact region that will become a source contact to the body region or (optionally) well region is doped with the second conductivity type. Doping may be performed by way of example and without limitation by ion implantation.

Once the implantation of the contact region is completed, the implanted regions must be activated. Activation or annealing requires raising the silicon carbide substrate composition to elevated temperatures. During silicon carbide-based MOSFET fabrication, dopant implant activation requires a temperature of around 1600° C.

Figure 8F:
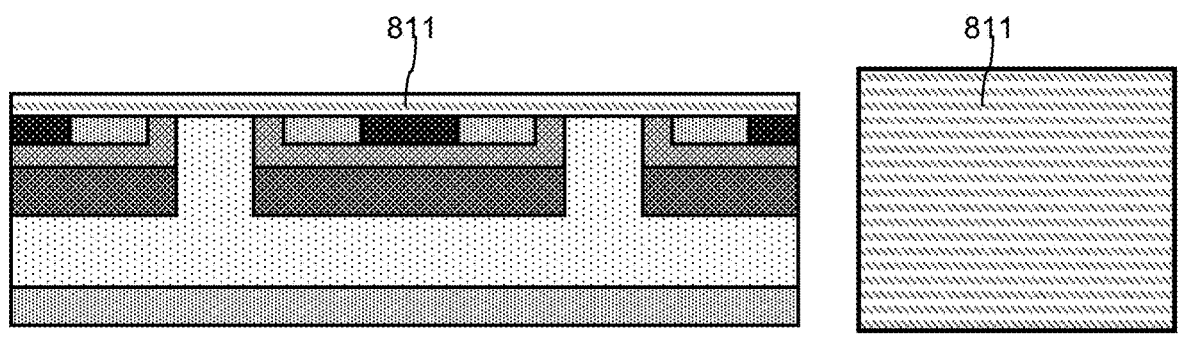
Figure 8G:
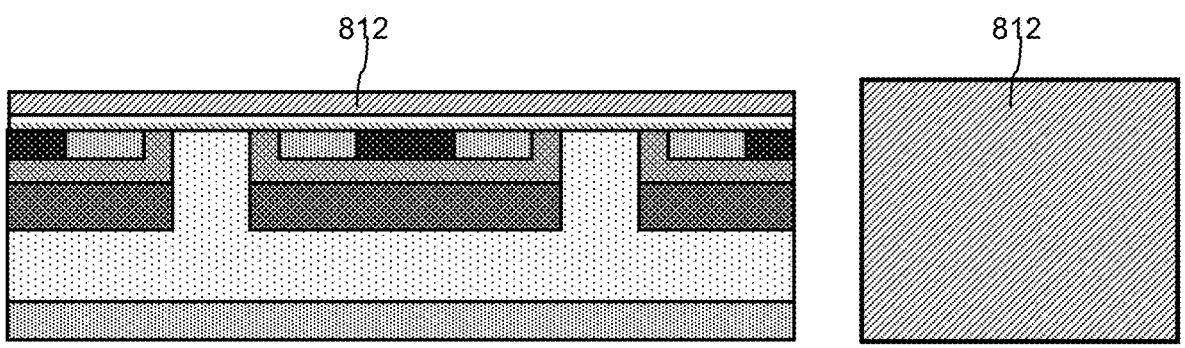
Figure 8H:
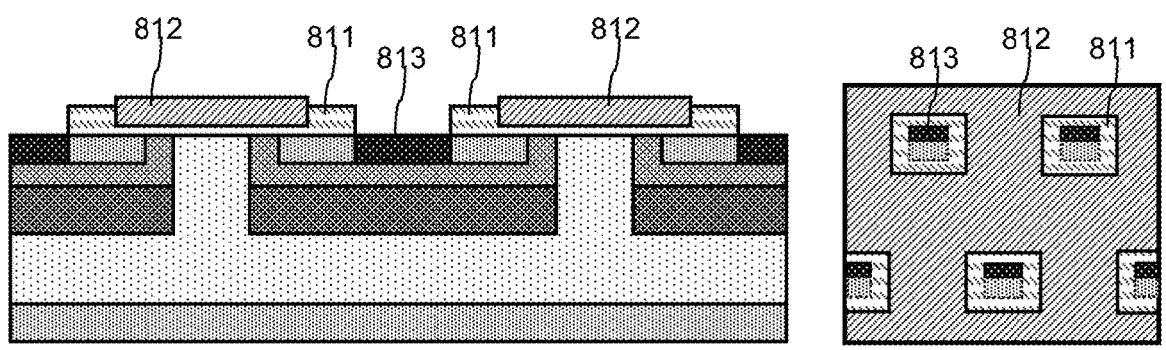
Figure 8I:
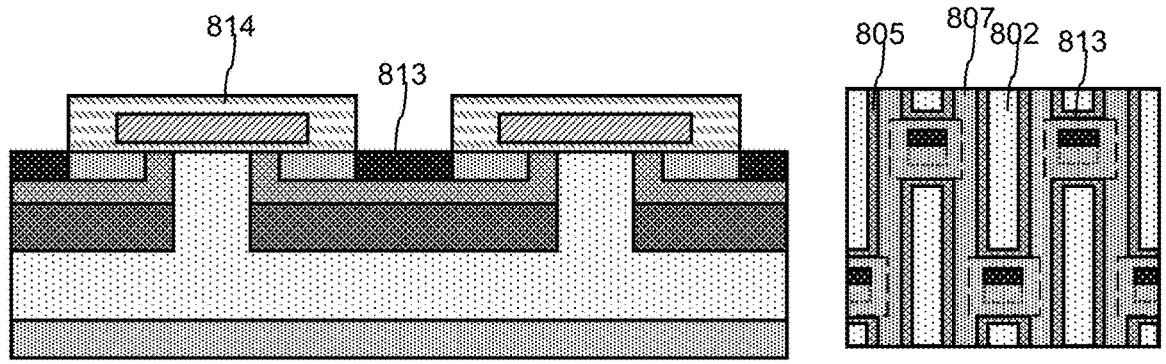

FIG. 8F shows formation of the insulator layer 811. The insulator layer 811 may be created on top of the substrate composition after removal of the mask 810. The insulator layer by way of example may be a silicon oxide layer grown or deposited over top the substrate composition. As can be seen from the top-down view the insulator layer 811 may cover the entire substrate composition at this step. A conductive layer 812 is then created on top of the insulator layer as depicted in FIG. 8G. The conductive layer 812 may be any conductive material known in the art for example, polysilicon or a metal such as Aluminum (Al), Molybdenum (Mo) or Tungsten (W) The conductive layer 812 and insulator layer 811 are then patterned and etched to reveal the contact regions 813 as shown in FIG. 8H. The patterned etching may create an opening in the conductor layer and insulator layer to the conductive region on the surface the substrate composition. The openings may have a pitch between 0.5-3 μm. More insulator 814, such as borophosphosilicate glass (BPSG), may cover upper surfaces of the conductive layer leaving the contact regions 813 open as shown in FIG. 8I. The top down view of FIG. 8I has the insulator layer 814 and conductive layer 812 removed to show the pattern of the well regions 805, source regions 807 and contact regions 813 underneath. In FIG. 8I openings through the insulator layers 811, 814 and conductive layer 812 are indicated by dotted and dashed lines, respectively. A source metal may finally be placed in the contact region to create a source metal contact; the source metal is in ohmic contact with the contact region. The source metal may be any suitable metal, such as Nickel, Titanium, or Aluminum or an alloy of a plurality of metals. Such metals may be deposited, e.g., by chemical vapor deposition (CVD) or physical vapor deposition (PVD).

It should be understood that the layout of the source regions, body, regions, well regions and contact regions depicted in FIGS. 1-7 may be produced by the method of fabrication shown in FIGS. 8A-8I and described above. While the fabrication steps have not been described in full detail, one ordinarily skilled in the art will recognize that any number of commonly-used fabrication techniques may be used to configure such a silicon carbide planar MOSFET integrated device.

Figure 8J:
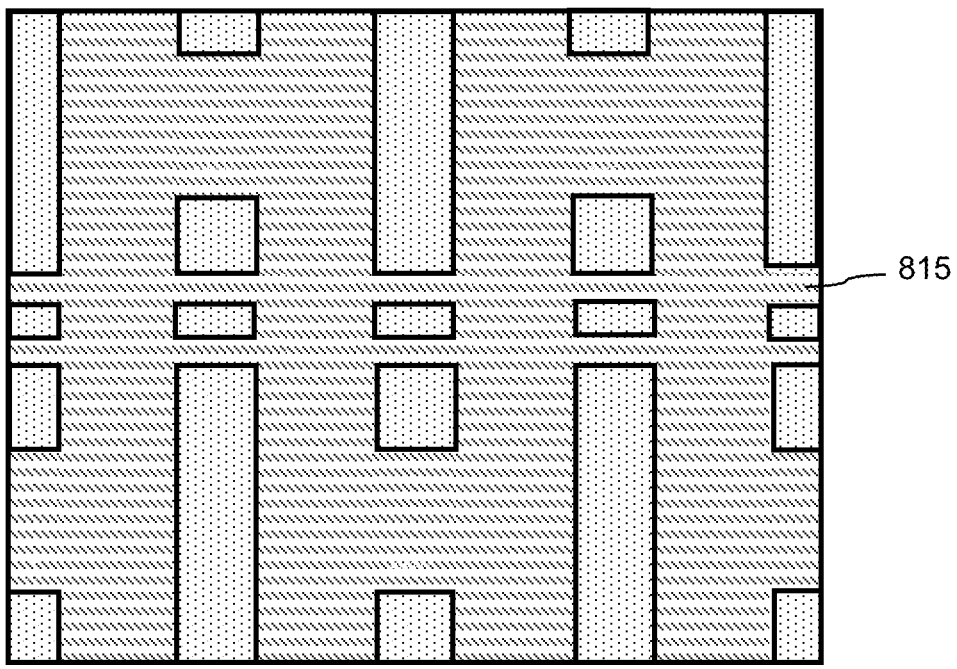
FIGS. 8J-8K show modification to the process for making a silicon carbide planar MOSFET integrated device with source ballasting to include a Schottky contact according to aspects of the present disclosure.
Figure 8K:
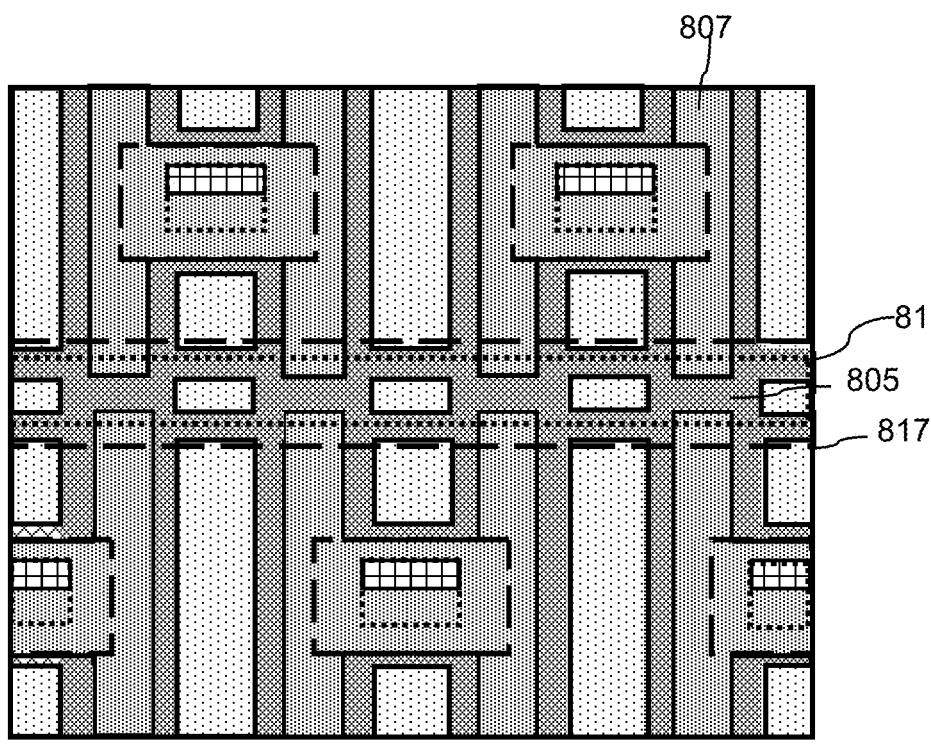

Creation of the silicon carbide planar MOSFET integrated device with Schottky diode is similar to that of the plain silicon carbide MOSFET integrated device as shown in FIGS. 8A-8C. The body region and (optionally) well region are formed in regions 815 where the Schottky contact will be placed as shown in FIG. 8J. Placement of the source region follows the same process as that of FIG. 8D with a gap placed in the source region 807 where the Schottky contact 816 will be placed as shown by the dotted line in FIG. 8K. The Schottky contact area 816 should fully overlap the JFET region (or well opening). The Schottky region 816 may or may not form an ohmic contact with the source region 807. After formation of the source region, formation of the integrated devices follows process of FIGS. 8E-8G. As further shown in FIG. 8K the insulator layer is etched away from where the Schottky contact area 816 will be placed. The conductive layer is also etched away in an area 817 indicated by the dashed line further from the Schottky contact area 816 to ensure that there is no conductive contact between the conductive layer and the Schottky contact. After formation of an insulator on top of the conductive layer as described with FIG. 8I, the Schottky contact is placed to create a Schottky diode. A Schottky contact is created by forming a Schottky barrier metal on the Schottky contact area 816. The Schottky barrier metal should be in ohmic contact with the channel region. The Schottky barrier metal may include Titanium/Titanium nitride (Ti/TiN) silicide, Nickel (Ni) and may be grown or deposited, RTP on the surface of the silicon composition in the Schottky contact area 816. A Schottky junction is formed at the interface between the barrier metal and epitaxial layer in the Schottky contact region. The Schottky barrier metal forms the anode of the Schottky diode and the substrate composition forms the cathode of the Schottky diode. A source metal may make contact to the source regions and the barrier metal through the openings in the insulator.

Figure 9:
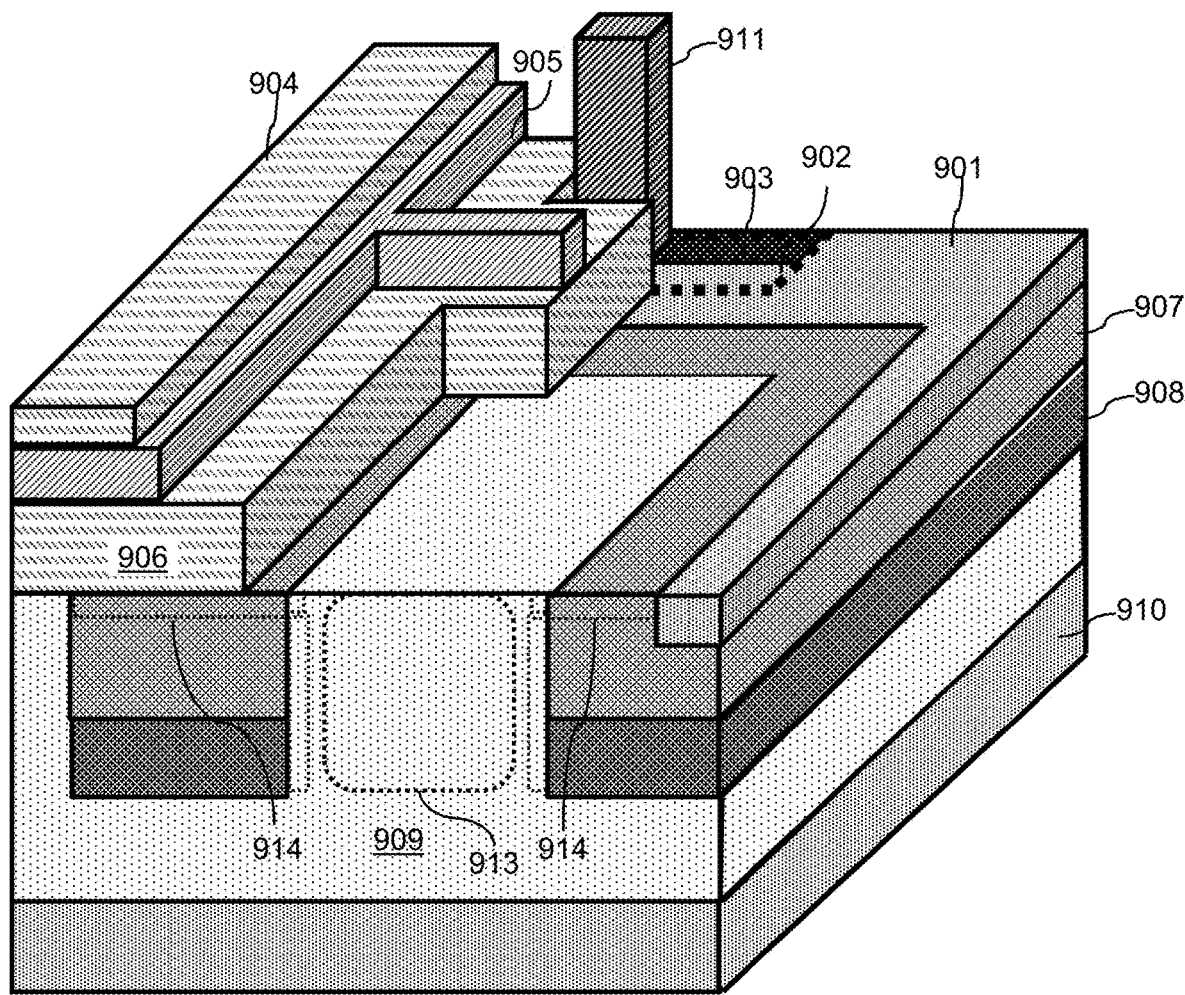
FIG. 9 depicts a three-quarters cutaway view of the silicon carbide planar MOSFET integrated device with source ballasting according to aspects of the present disclosure.

FIG. 9 shows a three-quarters view of an embodiment of the planar MOSFET integrated device according to aspects of the present disclosure. As depicted the source region 901 extends from the contact region 902 outward to bound the channel region 910. The source region is formed on top of the body region 908 and (optionally) on top of the well region 907. The body region 908 and (optionally) the well region 907 extend further around the source region 901 and also bound the channel region. The contact region is formed from the source region and a portion 903 of the contact region is doped with the second conductivity type. This portion of the contact region may by way of example be the P$^+$ contact region and ensures that the body region is at the same electric potential as the source region. The insulator layer 906 covers the majority of the substrate composition and has holes for the contact region 902. The conductive layer 905 (e.g., polysilicon) is located overtop the insulator layer and terminates before the contact region 902 so as not to be in ohmic contact with the source metal 911 at the contact region 902. The insulator layer is additionally formed on top of the conductive layer 904 and in the gap between the contact region 902 and the conductive layer 904. This additional insulator layer ensures that the conductive layer is isolated from the source metal 911.

During operation current flows from the source metal 911 through contact region 902 and to the source region 901 and the portion of the contact region doped with the second conductivity type 903. During operation voltage applied to the conductive layer 904 causes carrier alignment at the surface of the substrate composition allowing current to flow from the source region 901 across the body region 908 and (optionally) the well region 907 and in to the JFET region 913 via the channel region 914. The current then flows down through the epitaxial layer 909 and the substrate 910 to the drain.

Although the present invention has been described in considerable detail with reference to certain preferred versions thereof, other versions are possible. Therefore, the spirit and scope of the appended claims should not be limited to the description of the preferred versions contained herein. Instead, the scope of the invention should be determined with reference to the appended claims, along with their full scope of equivalents.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC § 122, ¶6.

The reader's attention is directed to all papers and documents which are filed concurrently with this specification and which are open to public inspection with this specification, and the contents of any papers and documents incorporated herein by reference.

What is claimed is:

1. An integrated device that includes a plurality of planar metal oxide semiconductor field effect transistors (MOSFETs), comprising:
   a) a silicon carbide substrate composition of a first conductivity type;
   b) a plurality of doped body regions of a second conductivity type that is opposite the first conductivity type formed in an upper portion of the substrate;
   c) a plurality of doped source regions of the first conductivity type, wherein each of the plurality of doped source regions is formed in an upper portion of each of the plurality of doped body regions;
   d) a first contact region formed in a first source region of the plurality of doped source regions, a second contact region formed in a second source region of the plurality of doped source regions wherein the first contact region and the second contact region have respective portions of the first source region and the second source region doped with the second conductivity type, wherein the first contact region is separated from the second contact region by a junction field effect transistors (JFET) region, wherein the JFET region is longer in one planar dimension than in another planar dimension, wherein the first contact region is separated from the second contact region by a distance greater than the one planar dimension of the JFET region in a direction parallel to the one planar dimension, wherein the JFET region is bounded on at least one side corresponding to the one planar dimension by a source region of the plurality of doped source regions and a body region of the plurality of doped body regions in conductive contact with at least one contact region of the first contact region and second contact region;
   e) an insulating layer formed on top of the silicon carbide substrate;
   f) an electrically conductive layer formed on the insulating layer and having openings corresponding to openings in underlying portions of the insulating layer over the first contact region and second contact region.

2. The integrated device from claim 1 wherein the first contact region and second contact region are staggered and each contact region has a corresponding JFET region, wherein the distance between the first contact region and second contact region in a direction perpendicular to the one planar dimension is shorter than the entire length of the one planar dimension of the JFET region but longer than a shorter planar dimension of the JFET.

3. The integrated device from claim 2 wherein a length of the first contact region corresponds to a shorter planar dimension for a first JFET region and a length of the second contact region corresponds to a shorter planar dimension for a second JFET region.

4. The integrated device from claim 2 wherein the source region bounding the JFET region is lightly doped with the second conductivity type and the contact region is heavily doped with the second conductivity type.

5. The integrated device from claim 4 wherein the doping concentration of the source region bounding the JFET region tapers to being lightly doped with the second conductivity type between the first contact region and second contact region.

6. The integrated device from claim 5 wherein the doping concentration of the source region bounding the JFET region increases to heavily doped with the second concentration near the contact region.

7. The integrated device from claim 2 wherein a gap in the source region bounding the JFET region is formed and wherein the body region is continuous between the first contact region and second contact regions.

8. The integrated device from claim 7 where in a Schottky contact is formed in the gap in the source region between the first contact region and second contact regions.

9. The integrated device of claim 1 wherein a Schottky contact is formed in the JFET region and fully overlaps the JFET region.

* * * * *